(12) United States Patent
Bexell et al.

(10) Patent No.: US 9,293,685 B2
(45) Date of Patent: Mar. 22, 2016

(54) ROTATING LOAD BEARER

(75) Inventors: Mats Bexell, Uppsala (SE); Per Oskar Lithell, Uppsala (SE)

(73) Assignee: PIEZOMOTOR UPPSALA AB, Uppsala (SE)

( * ) Notice: Subject to any disclaimer, the term of this patent is extended or adjusted under 35 U.S.C. 154(b) by 509 days.

(21) Appl. No.: 13/697,588

(22) PCT Filed: May 28, 2010

(86) PCT No.: PCT/EP2010/057459
§ 371 (c)(1),
(2), (4) Date: Nov. 13, 2012

(87) PCT Pub. No.: WO2011/147467
PCT Pub. Date: Dec. 1, 2011

(65) Prior Publication Data
US 2013/0062997 A1    Mar. 14, 2013

(51) Int. Cl.
*H02N 2/12* (2006.01)
*H01L 41/09* (2006.01)
*H02N 2/10* (2006.01)

(52) U.S. Cl.
CPC ............ *H01L 41/0913* (2013.01); *H02N 2/101* (2013.01); *H02N 2/12* (2013.01)

(58) Field of Classification Search
CPC ..... H02N 2/103; H02N 2/026; H01L 41/0913
USPC ........................................ 310/323.02, 323.04
See application file for complete search history.

(56) References Cited

U.S. PATENT DOCUMENTS

| 5,646,469 | A | * | 7/1997 | Tsukimoto | H02N 2/106 310/323.01 |
|---|---|---|---|---|---|
| 6,150,749 | A | * | 11/2000 | Tamai | H02N 2/106 310/323.12 |
| 6,184,609 | B1 | | 2/2001 | Johansson et al. | |
| 6,262,514 | B1 | * | 7/2001 | Bansevicius et al. | 310/323.01 |
| 6,337,532 | B1 | | 1/2002 | Johansson et al. | |

(Continued)

FOREIGN PATENT DOCUMENTS

| WO | 01/41228 A1 | 6/2001 |
|---|---|---|
| WO | 2009/128385 A1 | 10/2009 |

OTHER PUBLICATIONS

International Search Report, dated Feb. 9, 2011, from corresponding PCT application.

*Primary Examiner* — Shawki S Ismail
*Assistant Examiner* — Bryan Gordon
(74) *Attorney, Agent, or Firm* — Young & Thompson (57) ABSTRACT

An electromechanical rotating actuator arrangement (10) includes a stator (20), a rotor (30), a guide arrangement (50) and an object (40) to be moved. The stator (20) has electromechanically active actuators (22), exhibiting shape changes upon excitation, rigidly attached to a common stator block (24). The rotor (30) has a planar drive surface (32). The electromechanically active actuators (22) have a respective driving surface (26), situated in a common plane (27) parallel to the drive surface (32), for mechanical interaction with the drive surface (32) of the rotor (30). The object (40) to be moved is attached to the rotor (30), giving a rigid mechanical connection between the object (40) and the drive surface (32). The guide arrangement (50) is arranged for restricting translational motions of the rotor (30) perpendicular to the rotation axis (12). A method for driving an electromechanical rotating actuator arrangement (10) is also disclosed.

16 Claims, 8 Drawing Sheets

(56) References Cited

U.S. PATENT DOCUMENTS

| | | |
|---|---|---|
| 6,798,117 B2 | 9/2004 | Johansson et al. |
| 7,067,958 B2 | 6/2006 | Johansson et al. |
| 7,355,325 B2 | 4/2008 | Johansson et al. |
| 7,420,321 B2 | 9/2008 | Johansson |
| 2003/0052575 A1 | 3/2003 | Mock et al. |
| 2004/0160146 A1* | 8/2004 | Matsushita .......... H02N 2/0045 310/363 |
| 2005/0253485 A1* | 11/2005 | Kishi .................. H01L 41/0913 310/323.16 |
| 2006/0267454 A1* | 11/2006 | Ashizawa .............. H02N 2/163 310/323.02 |
| 2011/0068718 A1* | 3/2011 | Murakami .................... 318/116 |

* cited by examiner

ROTATING LOAD BEARER

TECHNICAL FIELD

The present invention relates in general to actuator arrangements and in particular to small, high-precision actuator arrangements.

BACKGROUND

Electromechanical actuator arrangements have been used for many years to achieve energy-efficient and precise motion of different objects. Typical applications are motion of lenses in optical systems, positioning of objects under a microscope, control of ink jet nozzles, etc.

In a typical prior art rotating electromechanical actuator system, an object to be rotated is attached to a rotating table. The rotating table is moved by action of an electromechanical actuator. The load of the object and the rotating table is acting against a support part, typically by means of rotational bearings. The bearings are typically radial or combined radial and axial bearings. For high precision positioning applications, very high demands are put on the actuator as well as on the bearing arrangements. Typically, the actuator is responsible for the accuracy in the driving direction, i.e. the rotated angle, while the bearing arrangement takes care of the eccentricity as well as the wobble around the rotation axis. The standard rotational bearings of today may provide an eccentricity in the order of below 3 µm. However, wobble is much more difficult to control. In many applications, there are requests of having a wobble that is less than 100 µrad. In order to provide such accuracies, multiple rotational bearings typically have to be provided at different axial positions. This in turn requires precision mounting of the bearings relative each other and also adds on the axial dimension of the rotating actuator system. Typical allowable loads can then be as high as 500 N.

A problem with rotating electromechanical actuator systems of today is that the rotation bearing arrangements require careful alignment and add to the total volume. In order to further reduce sizes of the electromechanical actuator systems while maintaining or even improving the accuracies very expensive solutions according to prior art have to be considered. At the same time, the loads are often much lower than the maximum limit, giving a very high load margin.

SUMMARY

An object of the present invention is to provide a rotating electromechanical actuator system for low-weight loads that is smaller, simpler and less expensive to produce, than prior art electromechanical actuator systems, and at the same time provides corresponding or better accuracies.

This object is achieved by electromechanical rotating actuator arrangements according to the enclosed patent claims. In general words, in a first aspect, an electromechanical rotating actuator arrangement comprises a stator, a rotor, a guide arrangement and an object to be moved. The stator has electromechanically active actuators rigidly attached to a common stator block. The electromechanically active actuators exhibit shape changes upon excitation. The rotor has a drive surface that is planar. Each of the electromechanically active actuators has a driving surface intended for mechanical interaction with the drive surface of the rotor caused by the shape changes of the electromechanically active actuators for causing a rotating motion of the rotor around a rotation axis perpendicular to the drive surface. The driving surfaces of the electromechanically active actuators are situated in a common plane parallel to the drive surface when the electromechanically active actuators are non-excited. The object to be moved is attached to the rotor in such a way that the attachment creates a rigid mechanical connection between the object to be moved and the drive surface of the rotor. The guide arrangement is arranged for restricting translational motions of the rotor perpendicular to the rotation axis.

In a second aspect, a method of driving an electromechanical rotating actuator arrangement comprises creation of a rigid mechanical connection between an object to be moved and a drive surface of a rotor. The rotor is then rotated relative to a stator around a rotation axis. The rotation is performed by providing an actuating action of electromechanically active actuators of the stator against the drive surface of the rotor. The actuating action is caused by shape changes of the electromechanically active actuators when being excited. Translational motions of the rotor are restricted perpendicular to the rotation axis.

One advantage with the present invention is that the intrinsic planarity of the actuator drive is utilized by simple means to ensure a low wobble of the rotational motion of the object. The number of mechanical parts that has to be mounted is also very limited, which makes the mounting easy and cheap. Furthermore, the configuration can be designed in a very compact form. Other advantages with the present invention are further discussed in connection with the different described embodiments further below.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the present disclosures, equal or directly corresponding features in different figures and embodiments will be denoted by the same reference numbers.

Figure 1:
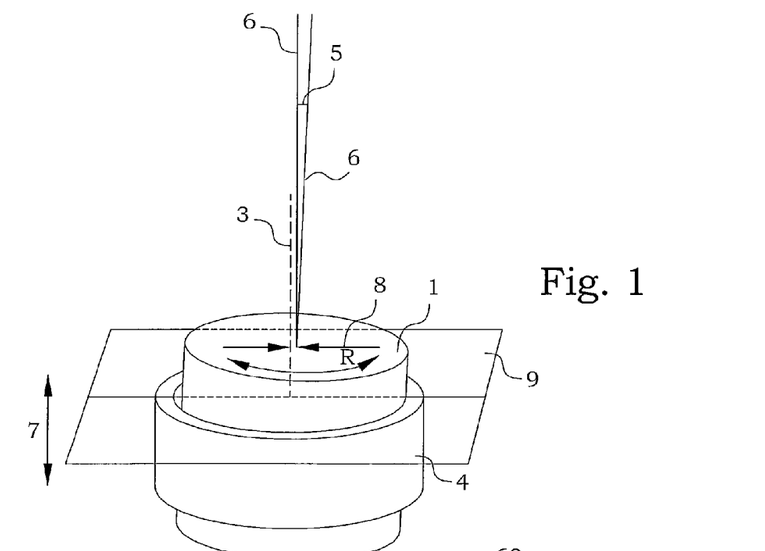
FIG. 1 is a schematic illustration of errors in a rotational system.

Throughout the present disclosure, different rotations and directions of displacements are discussed. In order to have the directions and rotations well defined, we use the definition as depicted in FIG. 1. A moving part 1 rotates as indicated by the double arrow R, typically in either direction. A rotation axis, in an ideal situation, for the moving part 1 is indicated by the broken line 3. This ideal rotation axis 3 can e.g. be defined by a certain plane 9 associated with a stationary part 4. During the actual rotation, the moving part 1 can be displaced or rotated in different ways. A tilt of the rotation axis around an axis that is perpendicular to the ideal rotation axis results in a wobble motion 5, as indicated by the arrow and the lines 6, illustrating possible actual rotation axes. A displacement 7 along the intended rotation axis 3 is in the present disclosure referred to as an axial runout. A displacement 7 perpendicular to the intended rotation axis 3 is in the present disclosure referred to as an eccentricity 8. The eccentricity 8 may also be referred to as a radial runout.

Figure 2:
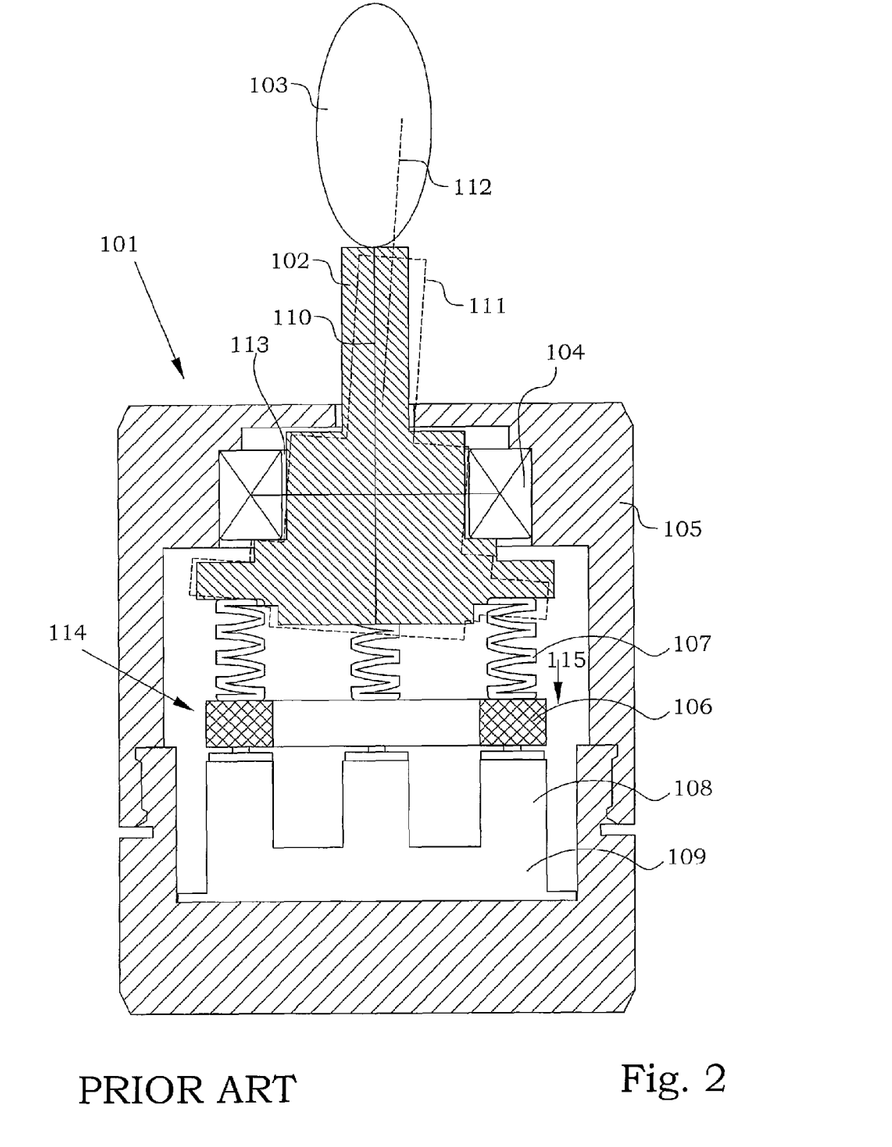
FIG. 2 is a cross-sectional view of an electromechanical rotating actuator arrangement according to prior art.

With reference to FIG. 2, in prior art electromechanical rotating actuator arrangements 101, the most common approach has been to provide a rotating support 102 onto which an actual object 103 to be moved is attached. The rotating support 102 is kept in place by a rotating bearing arrangement 104, which supports the load of the object 103 as well as of the rotating support 102. Typically, the bearing arrangement 104 is a combined radial and axial bearing, supporting the loads in both these directions. In the example illustrated in FIG. 2, the bearing arrangement is attached to a motor house 105. The rotational motion of the rotating support 102 is caused by interaction with a driving entity 114. In the present example, a number of electromechanically active elements 108 interact with a rotor 106. By exciting the electromechanically active elements 108, typically by applying different voltages, shape changes can be achieved, which can be utilised for causing a relative rotation of the rotor 106 and the electromechanically active elements 108 around a rotation axis 110. The electromechanically active elements 108 are attached to a common stator block 109, which in turn is connected to the motor house 105. The motion of the rotor 106 is transferred to the rotating support 102 by a number of springs 107. The springs 107 are relatively stiff in the tangential direction of the rotation, while giving a flexibility in the axial direction. The springs 107 are also pressing the rotor 106 against the electromechanically active elements 108 by a normal force 115.

The rotation accuracy in the tangential direction, i.e. the angle in which the rotating support 102 is turned around the rotation axis 110, is determined by the accuracy of the movement of the electromechanically active elements 108. The eccentricity is determined by the radial play 113 of the bearing arrangement 104. Note that in FIG. 2, this play 113 is extremely exaggerated, in order to visualize the accuracy relations. The eccentricity in high quality bearing arrangement 104 may be as good as a few micrometers.

This accuracy is acceptable for most applications. The wobble is also connected to the radial play 113. The radial play 113 allows for a certain tilting of the rotating support 102 from the ideal rotating axis. This is illustrated by the dotted line 111 and the tilted axis 112. Note that also this tilting is extremely exaggerated in the figure compared to typical arrangements. The amount of tilting and therefore the possible wobble is also determined by the geometrical shape and dimensions of the bearing arrangement 104. Since there typically is a request to keep the overall sizes small, even small plays give rise to relatively large wobbles. Typical high quality rotational bearings today present a wobble that is below ±100 μrad, and in extremely accurate rotational bearings even below ±20 μrad. Unfortunately, such high quality bearings are also very expensive.

Another possibility to reduce the wobble is to provide more than one bearing arrangement 104 separated by a distance along the rotation axis. The longer the distance is, the smaller the wobble becomes. However, this is generally not acceptable in miniature motor systems, where the overall size is one of the most critical parameters.

As a summary, in most prior art electromechanical rotating actuator arrangements, the bearing arrangement operates as the load bearing mechanism, whereas the electromechanical actuators only provide the actual driving function. The accuracy, e.g. the eccentricity and the wobble is thereby determined by the accuracies of the bearing arrangement. Accurate bearing arrangements are typically large and/or expensive.

In typical electromechanical actuator arrangements, the driving surfaces of the individual electromechanical actuators are typically extremely well planarized with respect to each other. In other words, when the electromechanical actuators are non-excited, their driving surfaces are aligned in one and the same plane with a high degree of accuracy. This ensures a good operation. At the same time, the drive surface of the moving part that is interacting with the electromechanical actuators also has to be very planar. In a typical motor, both of these planes, i.e. the common plane of the driving surfaces of the electromechanical actuators and the drive surface of the moving part, e.g. a rotor, may have an accuracy in the order of ±1 μm or even better than that. According to the present invention, this accuracy can be utilized to provide also an accuracy in the rotational motion of the object to be moved. To this end, the electromechanical actuators are themselves utilized, not only as driving elements, but also as load bearer. The interaction plane between the electromechanical actuators and the rotor can thereby be utilized as a reference plane for the motion of the object itself. The electromechanical rotating actuator arrangement is thereby preferably arranged for supporting a majority of a load caused by the object to be moved by the electromechanically active actuators. This will be further discussed in connection with the detailed descriptions of different embodiments here below.

Figure 3:
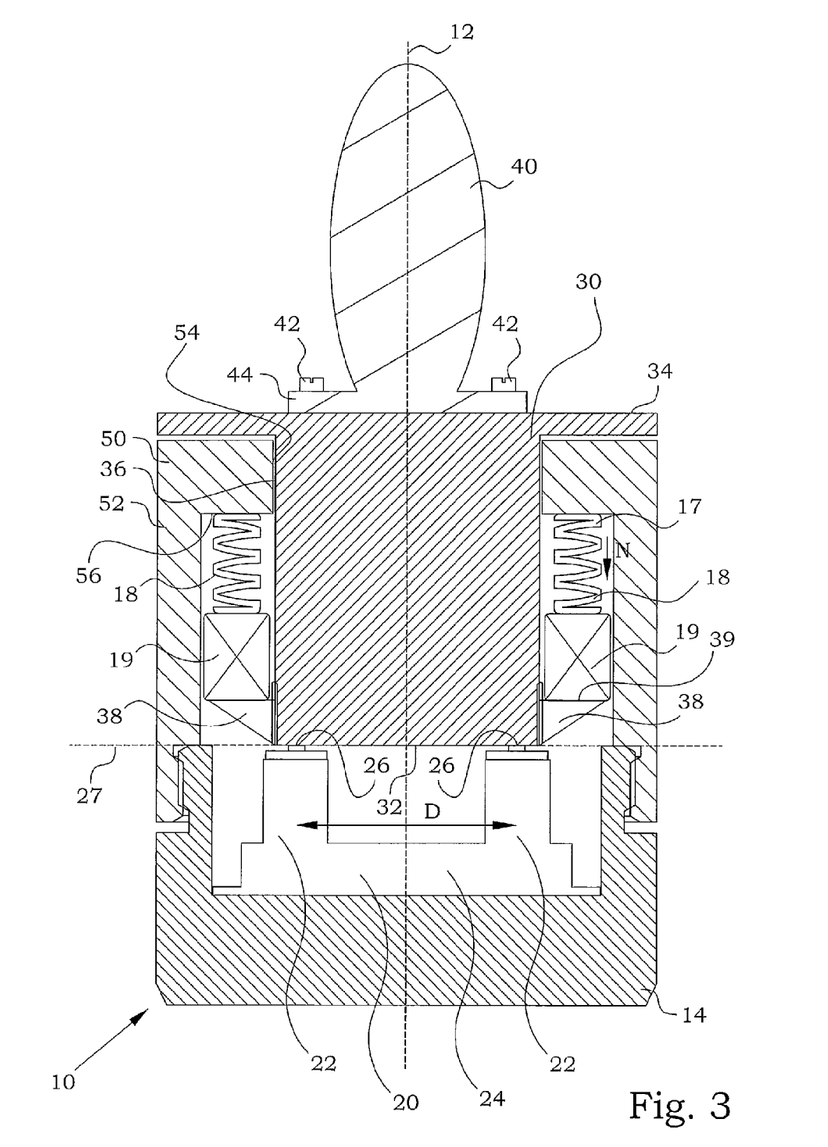
FIG. 3 is a cross-sectional view of an embodiment of an electromechanical rotating actuator arrangement according to the present invention.

A first explanatory embodiment of an electromechanical rotating actuator arrangement 10 according to the present invention is illustrated in FIG. 3. The electromechanical rotating actuator arrangement 10 comprises a stator 20 and a rotor 30. The stator 20 has electromechanically active actuators 22 rigidly attached to a common stator block 24. The electromechanically active actuators 22 exhibit shape changes upon excitation. Examples of this will be discussed further below. The stator 20 and the rotor 30 interacts, via a drive surface 32 of the rotor 30 and driving surfaces 26 on the electromechanically active actuators 22. The driving surfaces 26 are thus intended for mechanical interaction with the drive surface 32 of the rotor 30. This mechanical interaction is caused by the shape changes of the electromechanically active actuators 22. The excitations of the electromechanically active actuators 22 are performed in such a way that the interaction causes a rotating motion of the rotor 30 around a rotation axis 12 perpendicular to the drive surface 32. The stator 20 rests on an inside of a motor house 14.

The drive surface 32 of the rotor 30 is planar and the driving surfaces 26 of the electromechanically active actuators 22 are situated in a common plane 27 parallel to the drive surface 32 of the rotor 30 at least when the electromechanically active actuators 22 are non-excited. In a typical case, the common plane 27 and the drive surface 32 coincides.

An arrangement as the one illustrated in FIG. 3 is basically intended for rotation of an object 40. The nature of this object 40 is not of particular importance for the technical effect of the present invention and the object 40 can be of almost any kind. Non-exclusive examples of common objects to be moved are optical elements, objects to be analyzed by microscopes, micromechanical elements, parts of manufacturing equipment that needs to be moved and/or aligned etc. In the embodiments discussed here below, the objects 40 are illustration purposes illustrated as an unidentified, basically elliptical shape. One of the few conditions concerning the object 40 that is of importance for the present invention is that the object 40 is attached to the rotor 30. The object 40 may be directly mounted at a surface of the rotor 30 or via one or several other items. However, a rigid mechanical connection between the object 40 to be moved and the drive surface 32 of the rotor 30 has to be provided. The object 40 to be moved may also be manufactured as an integral part of the rotor 30 itself. In the present embodiment, a flange 44 of the object 40 is screwed by screws 42 directly onto a surface 34 of the rotor, opposite to the drive surface 32.

According to the present invention, the electromechanical rotating actuator arrangement 10 also comprises a guide arrangement 50. In the present embodiment, the guide arrangement 50 comprises a hollow cylinder 52, encircling the rotor 30. In other words, in this embodiment, the guide arrangement 50 is thereby positioned, with respect to the rotation axis 12, radially outside the rotor 30. The rotor 30 has in the present embodiment a guide surface 36 of a cylinder segment shape with a cylinder axis coinciding with the rotation axis 12. More precisely, the guide arrangement 50 of this embodiment is a hollow cylinder segment encircling at least a cylinder segment guide surface 36 of the rotor 30. A guide surface 54 of the hollow cylinder 52 is provided in close proximity of the guide surface 36 of the rotor 30. In the present embodiment, the guide surface 36 of the rotor is the full cylinder surface. The guide arrangement 50 is thus arranged for restricting translational motions of the rotor 30 perpendicular to the rotation axis 12. In this particular embodiment, the guide arrangement 50 is arranged for restricting translational motions of the guide surfaces 36 of the rotor 30. The guide surface 36 will then be directed radially outwards. In this way, the rotor 30 cannot be displaced very much in a direction perpendicular to the rotation axis 12. The play between the inner surface of the hollow cylinder 52 and the guide surfaces 36 of the rotor 30 defines the eccentricity of the rotor motion. The guide arrangement 50 is in this embodiment attached to the stator 20 via the motor house 14.

In the present embodiment, the electromechanical rotating actuator arrangement 10 further comprises a spring arrangement 17. The spring arrangement 17 comprises in this embodiment a number of springs 18 provided between a surface 56 of the hollow cylinder, being essentially perpendicular to the rotation axis 12, and an axial rotational bearing 19. The axial rotational bearing 19 is in turn supporting against a surface 39 of a protruding member 38 of the rotor 30. Also the surface 39 of the protruding member 38 is essentially perpendicular to the rotation axis 12. The spring arrangement 17 is thereby arranged for applying a normal force N between the rotor 30 and the common stator block 24, in this embodiment via the guide arrangement 50 and the motor house 14.

Note that the rotational bearing 19 is a pure axial bearing, which means that there are no radially directed forces transferred between the stator and rotor via this rotational bearing 19. The rotational bearing is only provided for allowing the application of the axially directed normal force N to the rotating rotor 30.

The normal force N is required for achieving an accurate operation of the motor. However, as illustrated in other embodiments further below, the force may be provided in other way than by a spring arrangement 17 or by spring arrangements of other types, e.g. by magnetic, electrostatic and/or gravitational means. In order to have a trustful operation of the electromechanical rotating actuator arrangement 10, it is preferably that the force between the electromechanically active actuators 22 and the drive surface 32 of the rotor 30 in the rotation axis is larger than any force between the rotor 30 and the guide arrangement 50 in a direction perpendicular to the rotation axis 12. Preferably, at each instant, the firm contact between at least some of the electromechanically active actuators 22 and the drive surface 32 of the rotor 30 has to be ensured. Most of the expected forces applied between the rotor 30 and the guide arrangement 50 have their origin in the movement of the object 40. These forces are typically connected to the load emanating from the object 40. In a typical case, this load corresponds to the weight of the object 40, but may in different applications also have contributions from other interactions, such as magnetic electrostatic etc. By providing an external normal force N, by e.g. a spring arrangement 17, that is five times, preferably ten times and more preferably twenty times, larger than an expected load from the object 40, the variations in the actual force between the electromechanically active actuators 22 and the drive surface 32 of the rotor 30 will be so small that the operation hardly is affected at all.

Besides influencing the actuator operational conditions, the force between the electromechanically active actuators 22 and the drive surface 32 of the rotor 30 ensures that the rotor 30 is rotated with the drive surface 32 coinciding with the common plane 27 of the driving surfaces 26 of the electromechanically active actuators 22. This in turn ensures a rotation with an accuracy that is determined essentially by the flatness of the drive surface 32 and the common plane 27 of the driving surfaces 26. Knowing that the planarity of these surfaces and planes easily can be in the range of ±1 µm, the expected maximum wobble can be estimated by the distance D between the different electromechanically active actuators 22. A pure sum of the height errors (4 µm) is a very crude estimation of a maximum axial difference, and even with a distance D of only 4 mm between the electromechanically active actuators 22, a maximum wobble of 1000 µrad is achieved, which corresponds to a prior-art solution with relatively high-quality bearings. By increasing the distance D to 20 mm, a maximum wobble will be 200 µrad, which is in the same range as the present state of the art. A distance D of 40 mm would give a maximum wobble of 100 µrad which to our present knowledge is better than other commercially available products. By further refining the planarization of the common plane 27 of electromechanically active actuators 22 and the rotor drive surface 32, and allowing a distance D in the order of 100 mm, wobbles in the order of 10-20 µrad could be feasible. Better planarity of the drive surface 32 of the rotor 30 and/or the common plane 27 will result in further better accuracy.

Many actuator materials could be characterized as electromechanical materials, but in the present disclosure we intend to use the term electromechanical materials as materials that change their shape when an electric voltage or current is applied. Typical examples of electromechanical materials are piezoelectric, electrostrictive and antiferroelectric materials and these materials could be single crystalline as well as polycrystalline or amorphous.

As an exemplifying model system, an electromechanical actuator based on a PIEZO LEGS® motor, produced by the applicant, is used. Such actuators are based on a quasi-static driving principle, in which at least one actuator is in contact with the driven body at each instant. However, the basic principle can be used together with also other types of electromechanical actuators. A non-exclusive example is electromechanical actuators operating according to the principle of stick-slip. In certain applications, even actuators operating according to resonance principles may be possible to use.

Figure 4:
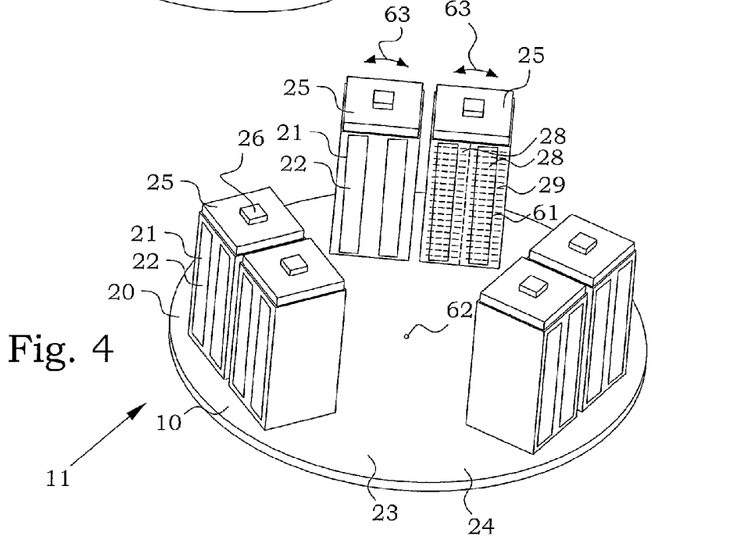
FIG. 4 is an elevation view of an embodiment of electromechanically active actuators that may be used in an electromechanical rotating actuator arrangement according to the present invention.

A simple sketch of a PIEZO LEGS® type rotating actuator is illustrated in FIG. 4. Here, a stator 20 of a rotational electromechanical motor 11, in this embodiment a piezoelectric motor, comprises in this embodiment a monolithic drive unit 23 consisting of piezoelectric bimorph drive elements or actuators 21. The piezoelectric bimorph drive elements 21 are one example of electromechanically active actuators 22. A contacting portion or interaction portion 25 is provided on top of the piezoelectric bimorph drive elements 21, presenting the driving surface 26. In FIG. 4, just one or a few of each type of member are provided with reference numbers in order to facilitate the figure reading.

The monolithic drive unit 23 comprises a passive backing as the common stator block 24. The passive backing and the drive elements 21 are made by multilayer techniques. In this embodiment, six drive elements 21 are used, separated by spaces. Each drive elements 21 is divided into two separately controllable phase segments 28. A number of phase and ground electrodes 29 layers are alternatingly incorporated within the drive elements 21, therefore indicated by broken lines, and terminations 61 contact the phase and earth electrodes 29 in the active areas in the drive elements 21. The phase electrodes within each phase segment 28 are connected together and controlled by a single voltage. Phase electrodes of the other phase segments are independently controllable. By applying a suitable voltage to selected electrodes, electrical fields will be applied within the actuators and result in an expansion or contraction of the material between the phase electrode layers and earth electrode layers. This will result in a bending and/or expansion/contraction of the drive elements 21. The drive elements 21 are geometrically configured to bend in a tangential direction with respect to a center 62 of the common stator block 24. This actuator motion, as indicated by the double arrows 63, can by proper choices of the shapes of the applied voltages be translated to a motion of a rotor provided on top of the driving surfaces 26 of the drive elements 21.

The preferred mechanism for moving a rotor by such a unit is of a non-dynamic type. Let us choose the first, third and fifth drive elements 21 in a tangential direction as the drive elements of a first set. These drive elements 21 are thus working synchronously. These drive elements 21 are in contact with the rotor. Similarly, the second, fourth and sixth drive elements 21 belong to a second set. These drive elements 21 are thus also working synchronously. The drive elements 21 are bimorphs with independently controllable voltages on the two sides of the bimorph. The top of the drive elements 21, the interaction portions 25, can therefore move arbitrarily within a certain area, if no load is present. For an ideal bimorph and for small strokes, this area constitutes a rhomb. For a certain phase-shifted motion of the two sets of drive elements 21, a motion of the rotor in a rotational movement around the center 62 is thereby possible to achieve. If repetitive voltage signals are applied on the drive elements 21, the interaction portions 25 will move along a certain trajectory within the admitted motion area.

More descriptions about this kind of actuators can be found in e.g. the U.S. Pat. No. 6,184,609, U.S. Pat. No. 6,337,532, U.S. Pat. No. 6,798,117, U.S. Pat. No. 7,067,958, U.S. Pat. No. 7,355,325, and U.S. Pat. No. 7,420,321.

Figure 5:
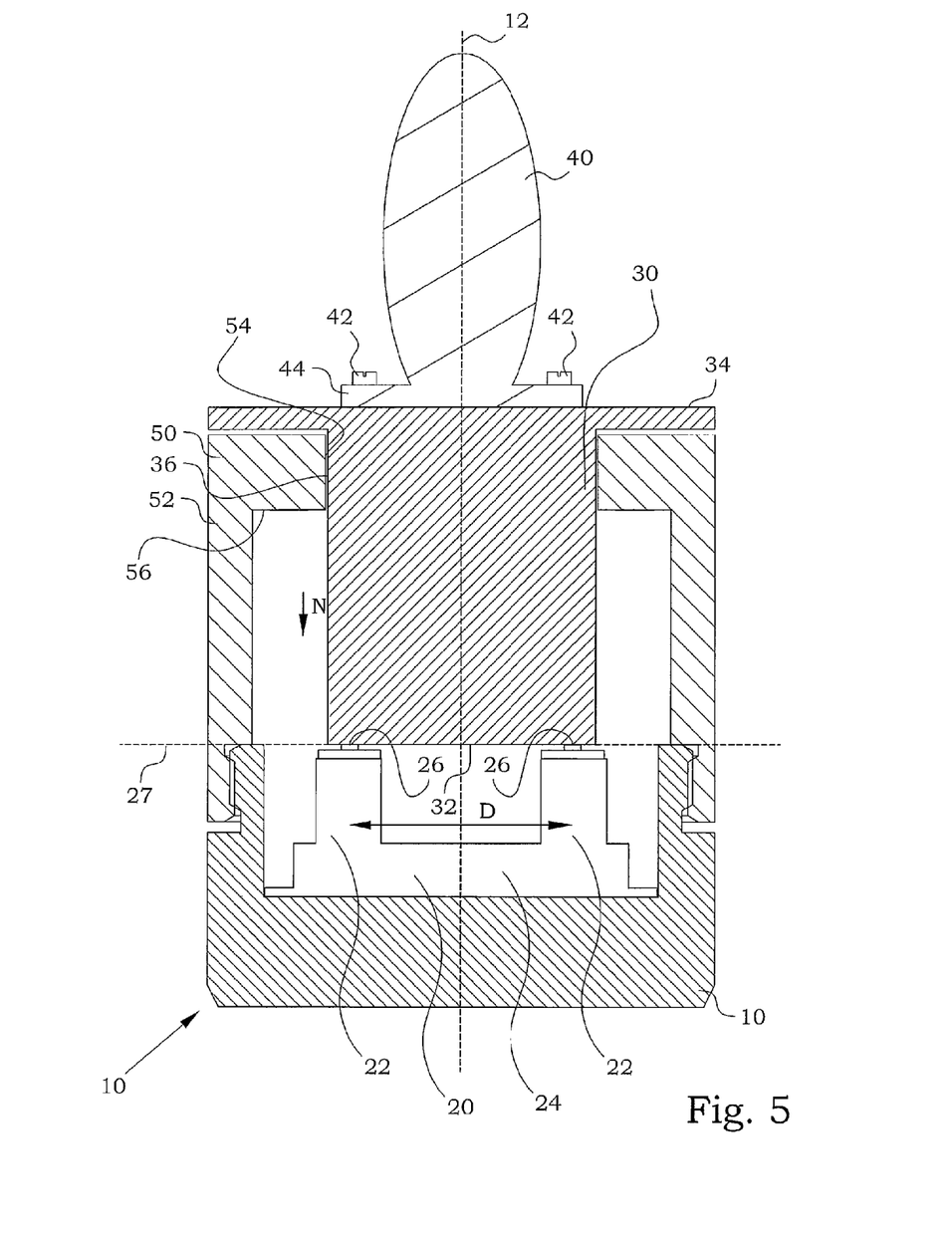
FIG. 5 is a cross-sectional view of another embodiment of an electromechanical rotating actuator arrangement according to the present invention.

As mentioned further above, a certain normal force is required to assure a well-defined operation of the actuators. In cases where the detailed load situations during operation in not known, an external arrangement is preferably used to provide such a normal force, e.g. the spring arrangement of FIG. 3. However, if the load situation is well analysed, the arrangements for providing the normal force can typically be simplified or even totally removed. One example is illustrated in FIG. 5. In this embodiment, the electromechanical rotating actuator arrangement 10 is known to be mounted in a vertical position, which means that essentially all load from the weight of the object 40 will operate as a force against the electromechanically active actuators 22. If the object 40 together with the rotor 30 itself is heavy, the gravitational force acting on the electromechanically active actuators 22 may be sufficient to provide the necessary normal force. Therefore in this particular embodiment, no additional arrangement for providing an additional normal force is necessary. Compared to the embodiment of FIG. 3, the springs and the rotational bearing have been omitted.

Figure 6:
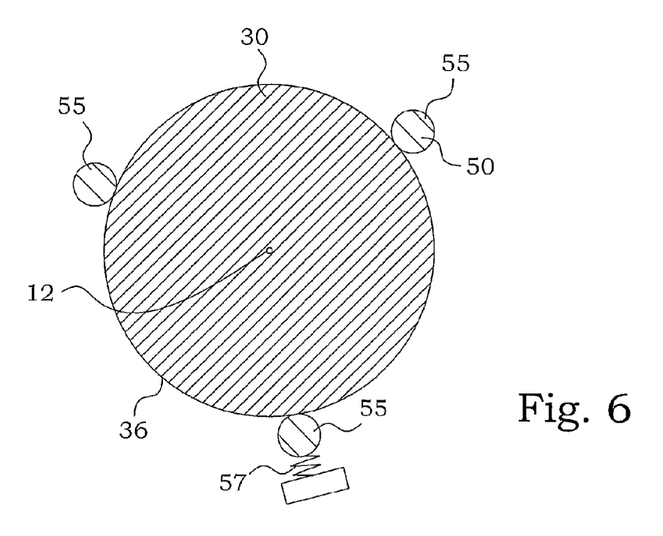
FIG. 6 is a cross-sectional view in a radial plane illustrating the interaction between a rotor and a guide arrangement in an embodiment of an electromechanical rotating actuator arrangement according to the present invention.

There are many different possibilities for detailed configurations of the guide arrangement. In FIGS. 3 and 5 above, the guide arrangement is positioned, with respect to the rotation axis, radially outside the rotor. Another embodiment of a useful guide arrangement 50 using this principle is schematically illustrated in a cross-sectional view perpendicular to the rotation axis 12 in FIG. 6. Here, the guide surface 36 of the rotor 30 is a cylinder surface with a cylinder axis coinciding with the rotation axis 12. The guide arrangement 50 comprises in this embodiment three guidance members 55 arranged at a same distance d from the rotation axis 12. The three guidance members 55 are arranged in three different directions perpendicular to the rotation axis 12, together surrounding the rotor 30. In alternative embodiments, more than three guidance members 55 may be utilized. In the present embodiment, the guidance members 55 are rods with a circular cross-section mounted along the guide surface 36 of the rotor 30 in an axial direction. This gives rise to a possible line contact between the rotor 30 and the guidance members 55. If the positioning of the rods is accurate enough, stationary rods may be used in all positions. However, in the present embodiment, one of the guidance members 55 of the guide arrangement 50 is resiliently urged against the guide surface 36 of the rotor 30 by means of a spring 57. This ensures that a contact always is provided between the guide arrangement 50 and the rotor, even if the guide surface 36 of the rotor 30 is not of a perfect circular shape.

As mention further above, it is preferable if any forces between the guide arrangement and the rotor are kept small. The reason for this is that any such force will give rise to a torque with respect to the rotation axis 12. When such a torque becomes non-negligible compared to the normal force, it may influence the actuator operation as well as the wobble of the rotor.

Figure 7:
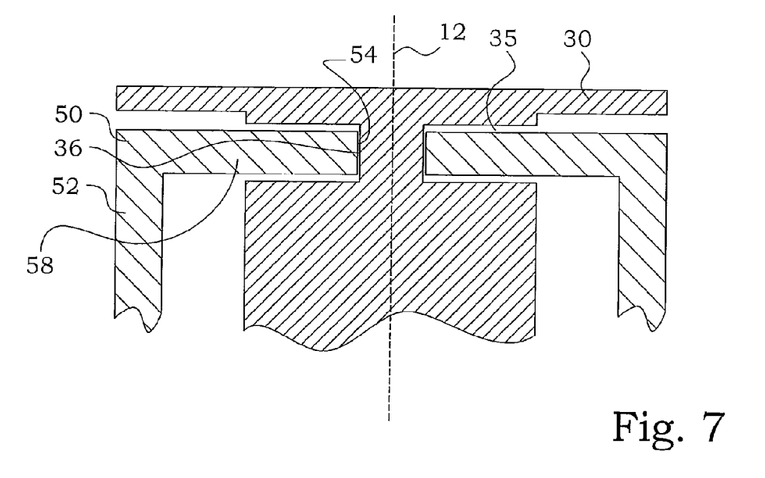
FIG. 7 is a cross-sectional view in an axial plane illustrating the interaction between a rotor and a guide arrangement in another embodiment of an electromechanical rotating actuator arrangement according to the present invention.

In FIG. 7, another embodiment is illustrated, which further reduces the sensitivity to forces between the guide arrangement 50 and the rotor 30. In this embodiment, the guide surface 36 of the rotor 30 is provided in a recess 35 on the rotor 30, which means that the distance between the rotation axis 12 and the point at which a force may be applied on the rotor is reduced, thereby reducing the possible torque. The guide arrangement 50 presents accordingly a guidance protrusion 58, protruding inwards in a radial direction to provide a guide surface 54 in close proximity to the guide surface 36 of the rotor 30

Figure 8:
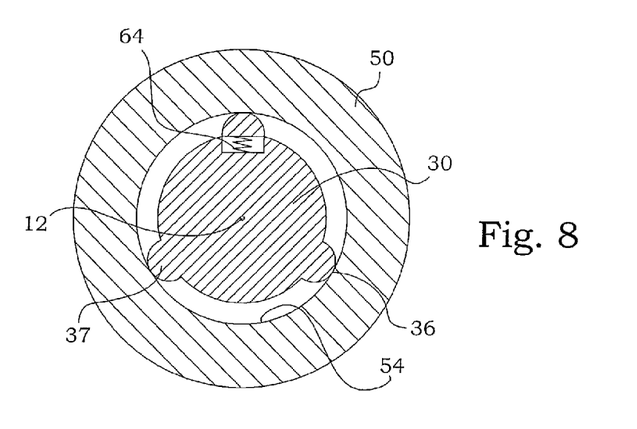
FIGS. 8-10 are a cross-sectional views in a radial plane illustrating the interaction between a rotor and a guide arrangement in embodiments of an electromechanical rotating actuator arrangement according to the present invention.

Another embodiment of a guide arrangement of an electromechanical rotating actuator arrangement according to the present invention is illustrated in FIG. 8. In previous embodiments, the rotor has provided at least segments of a circularly cylindrical surface. In the present embodiment, that principle is abandoned. Instead, the radial accuracy is instead assured in that the guide arrangement 50 has a guide surface 54 of a cylinder segment shape with a cylinder axis coinciding with the rotation axis 12. The rotor 30 has in this embodiment a main radius that leaves a relatively large slit to the guide surface 54. However, instead the rotor 30 is provided with, in this embodiment three, guidance members 37. The three guidance members 37 are arranged in three different directions perpendicular to the rotation axis 12, together surrounding the centre part of the rotor 30. In alternative embodiments, more than three guidance members 37 may be utilized. In the present embodiment, the guidance members 37 are rods with a half circular cross-section mounted on the main rotor part in an axial direction. This gives rise to a possible line contact between the guide surface 54 and the guidance members 37. If the positioning of the rods is accurate enough, stationary rods may be used in all positions. However, in the present embodiment, one of the guidance members 37 on the rotor 30 is resiliently urged against the guide surface 54 of the guide arrangement 50 by means of a spring 64. This ensures that a contact always is provided between the guide arrangement 50 and the rotor 30, even if the guide surface 54 of the guide arrangement 50 is not of a perfect circular shape.

Figures 9, 10:
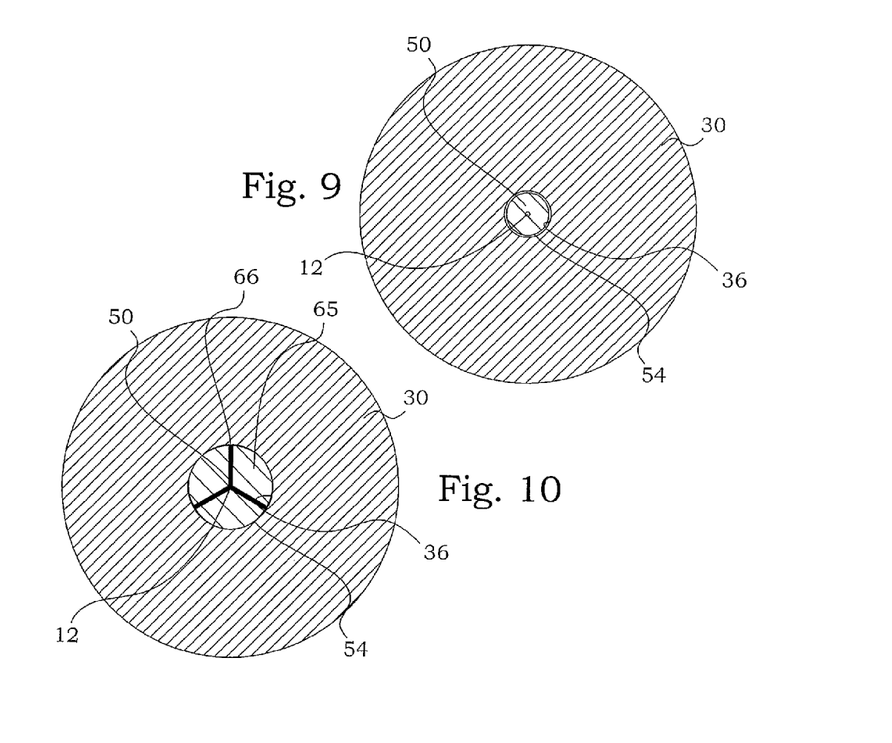

The guide arrangement can also be positioned, with respect to the rotation axis, radially inside the rotor. FIG. 9 illustrates such an embodiment. In this embodiment, the guide surface 36 of the rotor 30 is a hollow cylinder segment, or in this particular embodiment a full hollow cylinder surface, encircling the guide arrangement 50 in the shape of a rod. In other words, the guide surface 36 of the rotor is now a radially inward directed surface, which the guide surface 54 of the guide arrangement 50 is a radially outward directed surface. This particular embodiment has the advantage that the guide arrangement 50 does not increase the radial dimension of the entire arrangement. Furthermore, any interaction between the guide arrangement 50 and the rotor 30 takes typically place at a small distance from the rotation axis, which already has been considered as advantageously further above.

A modification of the central guidance approach is illustrated in FIG. 10. Here, the rod of the guide arrangement 50 is divided into three cylinder segments 65. The cylinder segments 65 are interconnected with a resilient material 66, providing a certain spring action between the cylinder segments 65. In this way, the guide arrangement 50 can constantly be hold in contact with the rotor 30.

In other embodiments, guiding outside and inside of the rotor can be combined, e.g. by having a guide arrangement of a hollow cylinder type where both the inner and out surfaces may be used for guiding purposes. Analogously, the rotor may exhibit different guide surface, some of which are directed radially outwards and some are directed radially inwards.

In certain applications a line of sight along the rotation axis is requested. This is easily provided with the solutions according to the present invention. A hole along the rotation axis through the rotor and/or the guide arrangement is easily provided. The rotor and/or the guide arrangement will then be of a tubular form rather than massive bodies.

Figure 11:
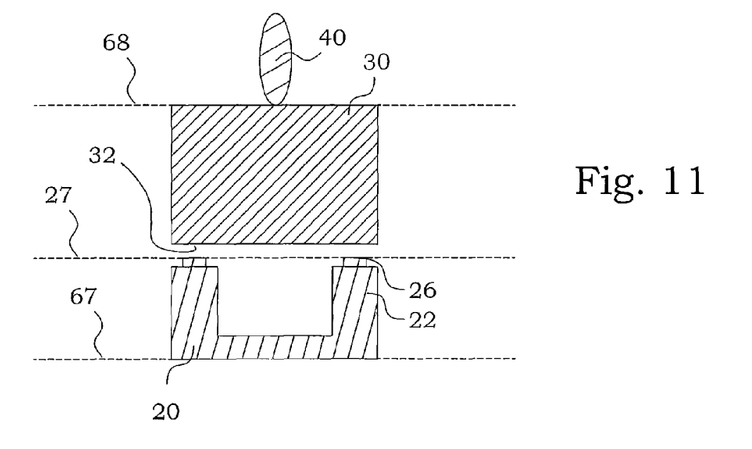
FIG. 11 is a schematic illustration of the planarity relations in an embodiment of the present invention.

As described above, one feature that allows building a low-wobble rotating actuator arrangement is the planarity relation between the common plane of the driving surfaces on the electromechanically active actuators and the drive surface of the rotor. The planarity of these planes is typically achieved by lapping procedures. The lapping is then typically performed as a plane parallel lapping, giving a member two plane parallel sides. This is illustrated in FIG. 11. A stator 20, with its electromechanically active actuators 22, is lapped, giving a flat common plane 27 of the driving surfaces 26 on the electromechanically active actuators 22. This common plane 27 is furthermore plane parallel to the back side of the common stator block 24. By utilizing this back side as a mounting surface 67, the stator 20, with its common plane 27 used for driving, can be positioned very accurately with respect to e.g. a motor house or any other external parts. Similarly, a rotor is also lapped, giving a flat drive surface 32 of the rotor 30. This drive surface 32 is furthermore plane parallel to an opposite, object surface 68 of the rotor 30. The object surface 68 is thereby furthermore during operation plane parallel to the common plane 27 of the driving surfaces 26 of the electromechanically active actuators 22, and in further view plane parallel to the mounting surface 67 of the stator 20. By mounting an object 40 relative the plane of the object surface 68, the object 40 thus becomes aligned with the mounting surface 67 of the stator 20 within a very high degree of accuracy.

Figure 12:
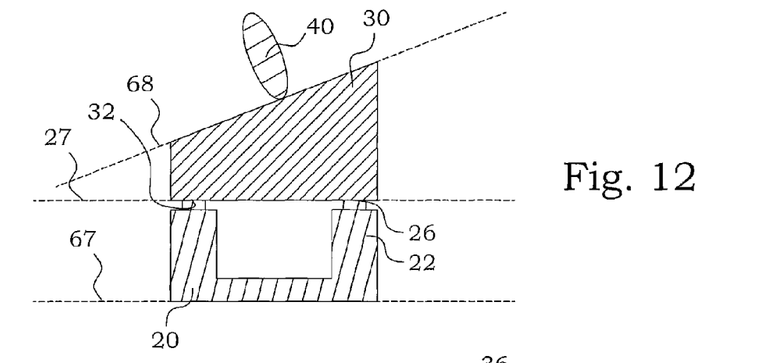
FIG. 12 is a schematic illustration of the planarity relations in another embodiment of the present invention.

It should, however, be noted that the mounting of the object may not always be requested to be parallel to the mounting surface 67 of the stator 20 or the common plane 27 of the driving surfaces 26 of the electromechanically active actuators 22. In FIG. 12, the rotor 30 is provided with a wedge shape. An object attached in a perpendicular direction from the upper surface of such a rotor will indeed present a wobbling. However, the accuracy of such a wobbling is determined by the principles discussed earlier.

Also other types of object mountings are possible to use together with the present ideas. However, aligning errors with respect to the drive surface of the rotor in such a mounting may deteriorate the accuracy concerning the wobbling.

Figure 13:
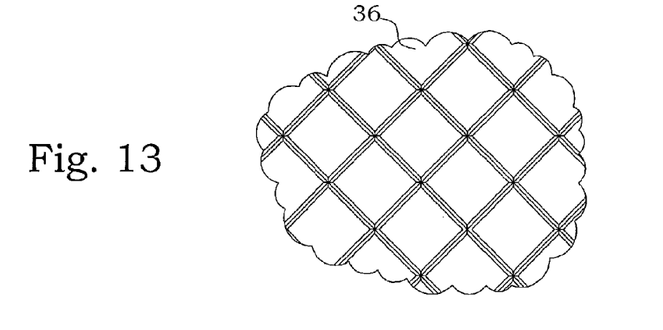
FIG. 13 is an illustration of a possible surface morphology useful in embodiments of electromechanical rotating actuator arrangements according to the present invention.

Anyone skilled in the art realizes that the shape of the guide surface 36 of the rotor 30 and/or the guide surface 54 of the guide arrangement 50 can be varied in many different ways, while still giving a guiding action when interacting. For instance, the constant radius with respect to the rotation axis does not necessarily have to be continuous. In FIG. 13, a guide surface 36 of a particular embodiment of a rotor is illustrated. Here, the guide surface 36 has a main surface interrupted by grooves. The main surface is predominating, providing a reliable guiding action, while the grooves may hold impurities or debris. This often makes the lapping or grinding operations of such surfaces easier to perform. Likewise, also the guide surface 54 of the guide arrangement 50 can analogously be split into part surfaces. It is, however, important that any structures on the guide surfaces 36, 54 do not open up for getting stuck with e.g. a corner of an opposite surface with which the guide surfaces 36, 54 interact.

Figure 14:
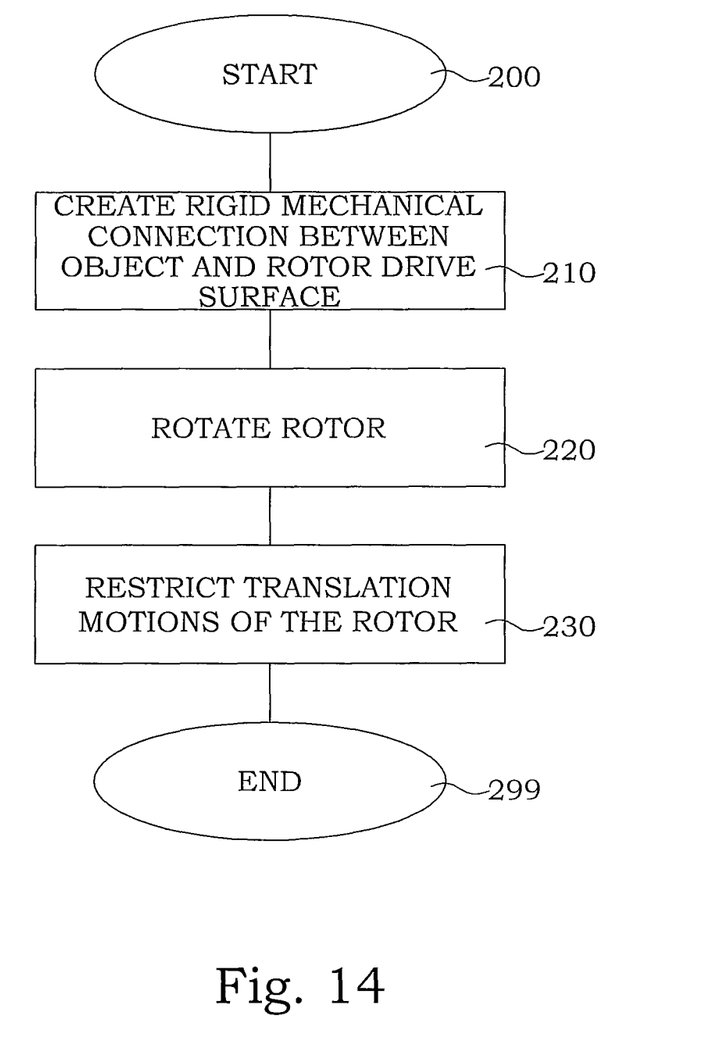
FIG. 14 is a flow diagram of steps of an embodiment of a method according to the present invention.

FIG. 14 illustrates a flow diagram of steps of an embodiment of a method according to the present invention. The method of driving an electromechanical rotating actuator arrangement begins in step 200. In step 210, a rigid mechanical connection is created between an object to be moved and a drive surface of a rotor. In step 220, the rotor is rotated relative to a stator around a rotation axis. The rotation is performed by providing an actuating action of electromechanically active actuators of the stator against the drive surface of the rotor. The actuating action is caused by shape changes of the electromechanically active actuators when being excited. In step 230, translational motions of the rotor are restricted perpendicular to the rotation axis. The method ends in step 299.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. An electromechanical rotating actuator arrangement for moving an object, comprising:
- a stator having a plurality of electromechanically active actuators rigidly attached to a common stator block, said electromechanically active actuators exhibiting shape changes upon excitation;
- a rotor having a drive surface that is planar, each of said electromechanically active actuators having a respective driving surface configured for direct mechanical interaction with said drive surface of said rotor,
    - said direct mechanical interaction being caused by said shape changes of said electromechanically active actuators to cause a rotating motion of said rotor around a rotation axis perpendicular to said drive surface,
    - said driving surfaces of each of said electromechanically active actuators being situated in a common plane parallel to said drive surface of said rotor when said electromechanically active actuators are non-excited; and
- a guide arrangement configured to restrict translational motions of said rotor perpendicular to said rotation axis,
- wherein the object to be moved is attached to the rotor thereby creating a rigid mechanical connection between the object to be moved and the drive surface of the rotor.

2. The electromechanical rotating actuator arrangement according to claim 1, wherein said electromechanical rotating actuator arrangement being configured to support a majority of a load, caused by said object, to be moved by said electromechanically active actuators.

3. The electromechanical rotating actuator arrangement according to claim 2, wherein said electromechanical rotating actuator arrangement being configured to a force between said electromechanically active actuators and said drive surface of said rotor in a direction of said rotation axis that is larger than any force between the rotor and the guide arrangement in a direction perpendicular to said rotation axis.

4. The electromechanical rotating actuator arrangement according to claim 1, wherein said guide arrangement being positioned, with respect to said rotation axis, radially outside said rotor.

5. The electromechanical rotating actuator arrangement according to claim 1, wherein said guide arrangement being positioned, with respect to said rotation axis, radially inside said rotor.

6. The electromechanical rotating actuator arrangement according to claim 1, wherein said rotor has a guide surface of a cylinder segment shape with a cylinder axis coinciding with said rotation axis and said guide arrangement being configured to restrict translational motions of said guide surfaces of said rotor.

7. The electromechanical rotating actuator arrangement according to claim 6, wherein said guide surface of said rotor is a cylinder surface with a cylinder axis coinciding with said rotation axis and said guide arrangement having at least three first guidance members arranged at a same distance from said rotation axis in respective different directions perpendicular to said rotation axis.

8. The electromechanical rotating actuator arrangement according to claim 7, wherein at least one of said first guidance members of said guide arrangement is resiliently urged against said guide surface of said rotor.

9. The electromechanical rotating actuator arrangement according to claim 1, wherein said guide arrangement has a guide surface of a cylinder segment shape with a cylinder axis coinciding with said rotation axis.

10. The electromechanical rotating actuator arrangement according to claim 9, wherein said guide surface of said guide arrangement is a cylinder surface with a cylinder axis coinciding with said rotation axis and said rotor having at least three second guidance members arranged at a same distance from said rotation axis in respective different directions perpendicular to said rotation axis.

11. The electromechanical rotating actuator arrangement according to claim 10, wherein at least one of said second guidance members of said rotor is resiliently urged against said guide surface of said guide arrangement.

12. The electromechanical rotating actuator arrangement according to claim 6, wherein said guide arrangement is a hollow cylinder segment encircling a cylinder segment guide surface of said rotor.

13. The electromechanical rotating actuator arrangement according to claim 6, wherein said guide surface of said rotor is a hollow cylinder segment encircling a cylinder segment of said guide arrangement.

14. The electromechanical rotating actuator arrangement according to claim 1, further comprising a spring arrangement configured to apply a normal force between said rotor and said common stator block.

15. The electromechanical rotating actuator arrangement according to claim 1, wherein said rotor has an object surface to which said object to be moved is attached, said object surface being plane parallel to said drive surface.

16. The electromechanical rotating actuator arrangement according to claim 1, wherein said common stator block has a mounting surface being plane parallel to said common plane of said driving surfaces of said electromechanically active actuators.

* * * * *

UNITED STATES PATENT AND TRADEMARK OFFICE
CERTIFICATE OF CORRECTION

| | | |
|---|---|---|
| PATENT NO. | : 9,293,685 B2 | Page 1 of 1 |
| APPLICATION NO. | : 13/697588 | |
| DATED | : March 22, 2016 | |
| INVENTOR(S) | : Mats Bexell et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 516 days.

Signed and Sealed this
Fourteenth Day of June, 2016

Michelle K. Lee
*Director of the United States Patent and Trademark Office*